(12) United States Patent
Rudmann et al.

(10) Patent No.: US 8,767,303 B2
(45) Date of Patent: Jul. 1, 2014

(54) METHOD FOR MANUFACTURING PASSIVE OPTICAL COMPONENTS, AND DEVICES COMPRISING THE SAME

(75) Inventors: Hartmut Rudmann, Jona (CH); Susanne Westenhoefer, Wettswil (CH); Bojan Tesanovic, Eglisau (CH)

(73) Assignee: Heptagon Micro Optics Pte. Ltd., Singapore (SG)

( * ) Notice: Subject to any disclaimer, the term of this patent is extended or adjusted under 35 U.S.C. 154(b) by 0 days.

(21) Appl. No.: 13/553,385

(22) Filed: Jul. 19, 2012

(65) Prior Publication Data
US 2013/0033767 A1 Feb. 7, 2013

Related U.S. Application Data

(60) Provisional application No. 61/509,357, filed on Jul. 19, 2011.

(51) Int. Cl.
*G02B 27/10* (2006.01)
(52) U.S. Cl.
USPC ........................................................ 359/620
(58) Field of Classification Search
CPC ... G02B 3/0056; G02B 3/0068; G03G 15/326
USPC .................. 359/620, 621, 622, 626
See application file for complete search history.

(56) References Cited

U.S. PATENT DOCUMENTS

| | | | |
|---|---|---|---|
| 4,952,026 A | | 8/1990 | Bellman et al. |
| 7,242,526 B2 * | | 7/2007 | Nemoto et al. ............... 359/626 |
| 7,957,067 B2 * | | 6/2011 | Yamamura ............... 359/622 |
| 8,274,742 B2 * | | 9/2012 | Yamamura ............... 359/621 |
| 2008/0290435 A1 | | 11/2008 | Oliver et al. |
| 2011/0031510 A1 * | | 2/2011 | Rossi et al. ............... 257/88 |
| 2011/0043923 A1 | | 2/2011 | Rossi et al. |
| 2011/0050979 A1 | | 3/2011 | Rudmann |

FOREIGN PATENT DOCUMENTS

| | | | |
|---|---|---|---|
| DE | 39 34 301 A1 | | 4/1990 |
| EP | 1 251 365 A1 | | 10/2002 |
| WO | 2005/083789 | | 9/2005 |
| WO | 2009/076790 A1 | | 6/2009 |
| WO | 2010/139342 A1 | | 12/2010 |

OTHER PUBLICATIONS

European Patent Office, International Search Report for PCT/CH2012/000160 (dated Sep. 19, 2012).

* cited by examiner

*Primary Examiner* — David N Spector
(74) *Attorney, Agent, or Firm* — Fish & Richardson P.C.

(57) ABSTRACT

A device comprises at least one optics member (O) comprising at least one transparent portion (t) and at least one blocking portion (b). The at least one transparent portion (t) is made of one or more materials substantially transparent for light of at least a specific spectral range, referred to as transparent materials, and the at least one blocking portion (b) is made of one or more materials substantially non-transparent for light of the specific spectral range, referred to as non-transparent materials. The transparent portion (t) comprises at least one passive optical component (L). The at least one passive optical component (L) comprises a transparent element (6) having two opposing approximately flat surfaces substantially perpendicular to a vertical direction in a distance approximately equal to a thickness of the at least one blocking portion (b) measured along the vertical direction, and, attached to the transparent element (6), at least one optical structure (5).

18 Claims, 4 Drawing Sheets

METHOD FOR MANUFACTURING PASSIVE OPTICAL COMPONENTS, AND DEVICES COMPRISING THE SAME

CROSS-REFERENCE TO RELATED APPLICATION(S)

This application claims priority from U.S. Provisional Patent Application No. 61/509,357, filed on Jul. 19, 2011, the contents of which are incorporated herein by reference.

TECHNICAL FIELD

This disclosure relates to the field of optics and more specifically to the manufacturing of optical and opto-electronic components. It relates to passive optical components and devices comprising these and to their manufacture.

BACKGROUND

In US 2011/0043923 A1, a way is described, of how passive optical components can be manufactured by means of replication. E.g., the forming by replication of lenses as a unitary parts is described therein.

In US 2011/0050979 A1, an optical module for an electro-optical device with a functional element is disclosed. In the manufacture of the module, lens elements are produced on a transparent substrate. In order to ensure an improved performance of the functional element, an EMC shield is provided. E.g., the substrate can, on one of its surfaces, be provided with a layer of non-transparent, electrically conductive material having apertures for the lens elements. The manufacture of a plurality of such modules on a wafer scale is also disclosed in US 2011/0050979 A1.

WO 2005/083789 A2 concerns a combination of passive optical elements with active optoelectronics. An optoelectronic wafer comprising active optical components is provided with (micro-) optical structures, wherein the optical structures are allocated to the active optical components. The optical structures are manufactured using replication.

Definition of Terms

"Active optical component": A light sensing or a light emitting component. E.g., a photodiode, an image sensor, an LED, an OLED, a laser chip.

"Passive optical component": An optical component redirecting light by refraction and/or diffraction and/or reflection such as a lens, a prism, a mirror, or an optical system, wherein an optical system is a collection of such optical components possibly also comprising mechanical elements such as aperture stops, image screens, holders.

"Opto-electronic module": A component in which at least one active and at least one passive optical component is comprised.

"Replication": A technique by means of which a given structure or a negative thereof is reproduced. E.g., etching, embossing, molding.

"Wafer": A substantially disk- or plate-like shaped item, its extension in one direction (z-direction or vertical direction) is small with respect to its extension in the other two directions (x- and y-directions or lateral directions). For example, on a (non-blank) wafer, a plurality of like structures or items are arranged or provided therein, e.g., on a rectangular grid. A wafer may have opening or holes, and a wafer may even be free of material in a predominant portion of its lateral area. Although in many contexts, a wafer is understood to be prevailingly made of a semiconductor material, in the present patent application, this is explicitly not a limitation. Accordingly, a wafer may prevailingly be made of, e.g., a semiconductor material, a polymer material, a composite material comprising metals and polymers or polymers and glass materials. In particular, hardenable materials such as thermally or UV-curable polymers are interesting wafer materials in conjunction with the presented invention.

"Lateral": cf. "Wafer"

"Vertical": cf. "Wafer"

"Light": Most generally electromagnetic radiation; more particularly electromagnetic radiation of the infrared, visible or ultraviolet portion of the electromagnetic spectrum.

SUMMARY

Some implementations provide one or more of the following advantages. For example, some implementations create an improved way of manufacturing passive optical components and devices comprising at least one such passive optical component. More generally, a device and methods for manufacturing a device are disclosed, wherein the device comprises at least one optics member and at least one passive optical component, respectively. The device and the passive optical component, respectively, can be identical with the device and the passive optical component, respectively, itself.

Also, some implementations provide a relatively simple way of manufacturing such devices and provide corresponding devices.

Further, some implementations provide a way of manufacturing such devices, in particular in large numbers, using a particularly small number of manufacturing steps and providing corresponding devices.

Some implementations provide a particularly efficient way of manufacturing such devices and to provide corresponding devices. In particular, the assembly can be particularly efficient.

Some implementations provide a particularly cost-effective way of manufacturing such devices and to provide corresponding devices. In particular, the assembly can be particularly cost-effective.

Some implementations provide a particularly time-saving way of manufacturing such devices and provide corresponding devices.

Some implementations provide devices of particularly small outer dimensions and provide corresponding manufacturing methods.

Some implementations provide devices having a particularly high level of integration and to provide corresponding manufacturing methods.

Some implementations provide devices consisting of a particularly small number of constituents and provide corresponding manufacturing methods.

Some implementations provide devices having a particularly accurate relative positioning of individual optical components comprised in the device and provide corresponding manufacturing methods.

Some implementations provide devices having particularly good optical properties and provide corresponding manufacturing methods.

At least one of these objects is at least partially achieved by devices and methods according to the patent claims.

The method for manufacturing a device comprising at least one passive optical component comprises:

a) providing a wafer comprising at least one blocking portion and a multitude of transparent elements;

wherein each of the multitude of transparent elements is made of transparent material substantially transparent for light of at least a specific spectral range, and the at least one blocking portion is made of non-transparent material substantially non-transparent for light of the specific spectral range.

This can be useful in many aspects and applications and devices, as will be become clear from the text below. E.g., an efficient manufacturing of passive optical components on wafer level can be accomplished this way, in particular wherein at least a portion of the passive optical components (in particular optical structures as described further below) extends vertically beyond the vertical extension of the surrounding wafer portions, the surrounding wafer portions being, for example, formed by the blocking portion.

The device can comprise at least a portion of the wafer.

Examples of lateral dimensions of the wafer are at least 5 cm or 10 cm, and up to 30 cm or 40 cm or even 50 cm; examples of vertical dimensions are at least 0.2 mm or 0.4 mm or even 1 mm, and up to 6 mm or 10 mm or even 20 mm.

For example, the passive optical component is provided for influencing, in particular for guiding light.

In some embodiments, each of the multitude of transparent elements is laterally adjacent to the at least one blocking portion.

In some embodiments which may be combined with the before-addressed embodiment, each of the multitude of transparent elements is laterally encircled by the at least one blocking portion.

In some embodiments which may be combined with one or more of the before-addressed embodiments, the at least one blocking area is made substantially of exactly one non-transparent material.

In some embodiments which may be combined with one or more of the before-addressed embodiments, a vertical extension of each of the multitude of transparent elements is at least approximately equal to a vertical extension of the at least one blocking portion.

In some embodiments which may be combined with one or more of the before-addressed embodiments, each of the multitude of transparent elements has two opposing at least approximately flat surfaces substantially perpendicular to a vertical direction.

In some embodiments which may be combined with one or more of the before-addressed embodiments, the method comprises the step of d) manufacturing the wafer;

wherein step d) comprises the steps of d1) providing a precursor wafer substantially made of the non-transparent material having openings in places where the transparent elements are supposed to be located;

d2) at least partially filling the openings with at least one of the transparent materials.

This can be a particularly efficient way of manufacturing the wafer.

In some embodiments referring to the before-addressed embodiment, during step d2), the transparent materials are in a liquid or viscous state, and wherein subsequent to step d2), the step of d3) hardening the transparent material;

is carried out. In particular, the hardening comprises curing.

In some embodiments referring to one or both of the two before-addressed embodiments comprising steps d1) and d2), step d2) is carried out using a dispenser. Therein, one or several of the openings can be filled at a time.

An alternative to using a dispenser is using a squeegee process, e.g., like used in a screen-printing process.

In some embodiments referring to one or more of the before-addressed embodiments comprising steps d1) and d2), the method comprises the step of manufacturing the precursor wafer using replication. This can be very efficient. When a hardening step is carried out during the replication, e.g., a curing step, this will rather by done by heating, because a non-transparency of the non-transparent material of the blocking portion may in many cases be accompanied by a non-transparency for radiation that would be used for accomplishing radiation hardening.

An alternative to replication is creating the openings by means of drilling or etching, or to manufacture the precursor wafer using molding. If molding is used, duroplastic injection molding can be a particularly suitable method for various applications.

In some embodiments which may be combined with one or more of the before-addressed embodiments, the method comprises the step of c) manufacturing an optics wafer comprising a multitude of passive optical components comprising the at least one passive optical component;

wherein step c) comprises the step of c1) producing the multitude of passive optical components by producing on each of the multitude of transparent elements at least one optical structure.

For example, the at least one optical structure is provided for influencing, in particular for guiding light more particularly for redirecting light.

It is possible to provide that the device is or comprises the optics wafer or comprises a portion thereof.

In some embodiments referring to the before-addressed embodiment (comprising steps c) and c1)), the at least one optical structure comprises at least one lens element.

This is an example application. The lens element can be a lens being a constituent of a composed lens comprising in addition at least one of the transparent elements.

The lens element itself and a composed lens as mentioned before can work based on refraction and/or on diffraction.

Instead of a lens element (or in addition thereto), other elements such as a prism element may be comprised in the optical structure. And coated elements may be suitable, too, e.g., a transparent part coated with a reflective coating, serving as a mirror element.

In some embodiments referring to one or more of the before-addressed embodiments comprising steps c) and c1), the producing the optical structures (mentioned in step c1)) is carried out using replication. This is a very efficient and precise way of producing the optical structures.

For example, a replication material used for the replication is substantially transparent for light of the specific spectral range (at least when the replication material is in a hardened state). A way of carrying out the replication suitable for many applications comprises embossing.

In some embodiments referring to the before-addressed embodiment, the producing the optical structures using replication comprises the steps of r1) applying a replication material to each of the multitude of transparent elements;

r2) replicating a structured surface in the replication material;

r3) hardening the replication material;

r4) removing the structured surface.

Steps r1) to r4) can be subsequently carried out in the cited order or in the order r2, r1, r3, r4.

Replication material is a hardenable, for example, curable material; in particular hardenable and curable, respectively, using ultraviolet radiation or heating. Suitable replication materials can be, e.g., polymers such as epoxy resins.

It is possible to provide that the producing the optical structure using replication is carried out in one replication process simultaneously for all of the optical structures. But it is also possible to provide that the producing the optical structures using replication is carried out by subsequently carrying out a multitude of replication processes, such as one replication process for each of the optical structures, but possibly one single replication process for a fraction of all of the optical structures.

In some embodiments referring to the before-addressed embodiment comprising steps r1) to r4), the replicating mentioned in step r2) is carried out in an aligned manner; more specifically such that the structured surface is aligned in a well-defined manner with respect to at least one of the multitude of transparent elements.

In some embodiments referring to one or more of the before-addressed embodiments comprising steps c) and c1), the method comprises the step of e) preparing a wafer stack comprising the optics wafer and at least one additional wafer;

f) obtaining a multitude of separate modules each comprising at least one of the multitude of passive optical components, by separating the wafer stack.

In some embodiments referring to the before-addressed embodiment (comprising steps e) and f)), step e) comprises fixing, in particular bonding the wafers of the wafer stack with respect to each other, e.g., by gluing, e.g., using a heat-curable epoxy resin.

In some embodiments referring to one or more of the before-addressed embodiments comprising steps e) and f)), step e) comprises aligning the wafers of the wafer stack with respect to each other, in particular in such a way that they are suitably aligned when fixing them with respect to each other.

In some embodiments which may be combined with one or more of the before-addressed embodiments comprising steps e) and f), at least one of the additional wafers comprises a multitude of active optical components, the separate modules each comprising at least one of the multitude of active optical components. Therein, for example, each of the transparent elements and passive optical components, respectively, is allocated with at least one of the multitude of active optical components; and this can be provided for during manufacturing by aligning the wafer accordingly.

In some embodiments which may be combined with one or more of the before-addressed embodiments comprising steps e) and f), at least one of the additional wafers is a spacer wafer structured and configured for providing a well-defined vertical distance between the passive optical components and mechanical stops provided by the spacer wafer.

It is possible to provide that the device is or comprises the wafer stack or comprises a portion thereof.

It is possible to provide that the device is or comprises one or at least one of the modules.

In addition to the method addressed above, the invention also comprises a device:

The device comprises at least one optics member comprising at least one transparent portion and at least one blocking portion, wherein the at least one transparent portion is made of one or more materials substantially transparent for light of at least a specific spectral range, referred to as transparent materials, and the at least one blocking portion is made of one or more materials substantially non-transparent for light of the specific spectral range, referred to as non-transparent materials, the transparent portion comprises at least one passive optical component, the at least one passive optical component comprises a transparent element having two opposing at least approximately flat surfaces substantially perpendicular to a vertical direction, and, attached to the transparent element, at least one optical structure.

The invention comprises devices with features of corresponding methods according to the invention, and, vice versa, also methods with features of corresponding devices according to the invention.

The advantages of the devices basically correspond to the advantages of corresponding methods, and, vice versa, the advantages of the methods basically correspond to the advantages of corresponding devices.

In some embodiments, the transparent element is a unitary part.

In some embodiments which may be combined with the before-addressed embodiment, the passive optical component is not a unitary part. It comprises at least two constituents, e.g., two or three constituents. These can be, for example, the transparent element and the at least one optical structure.

In some embodiments which may be combined with one or more of the before-addressed device embodiments, the two opposing at least approximately flat surfaces are arranged in a distance at least approximately equal to a thickness of the at least one blocking portion measured along the vertical direction.

In some embodiments which may be combined with one or more of the before-addressed device embodiments, each constituent of each of the transparent portions is made of one (single) transparent material, wherein these can be identical or different for one of more of the constituents of each of the transparent portions.

In some embodiments which may be combined with one or more of the before-addressed device embodiments, the at least one transparent portion is identical with the at least one passive optical component.

In some embodiments which may be combined with one or more of the before-addressed device embodiments, the optics member without the at least one optical structure is generally planar.

In some embodiments which may be combined with one or more of the before-addressed device embodiments, the optics member without the at least one optical structure is of generally block- or plate-like shape.

It is possible to provide that the device is one such optics members.

In some embodiments which may be combined with one or more of the before-addressed device embodiments, the at least one blocking portion is made of a hardened hardenable material, in particular of a cured curable material.

In some embodiments which may be combined with one or more of the before-addressed device embodiments, the at least one blocking portion is manufactured using replication. An alternative method would be to start from a blank wafer and use drilling or etching, or to use molding for manufacturing the at least one blocking portion.

In some embodiments which may be combined with one or more of the before-addressed device embodiments, the transparent element is made of a hardened hardenable material, in particular of a cured curable material. If the transparent element is manufactured using dispensing, a hardened hardenable dispensable material can be used. If the transparent element is manufactured using a squeegee process, a hardened hardenable material applicable in a squeegee process can be used.

In some embodiments which may be combined with one or more of the before-addressed device embodiments, the at least one optical structure is made of a hardened hardenable material, in particular of a cured curable material.

In some embodiments which may be combined with one or more of the before-addressed device embodiments, the passive optical component comprises at least one optical structure attached to each of the opposing surfaces, in particular, it comprises exactly one optical structure per opposing surface.

In some embodiments which may be combined with one or more of the before-addressed device embodiments, the device comprises an opto-electronic module in which the at least one optics member is comprised.

In some embodiments referring to the before-addressed embodiment, the opto-electronic module comprises at least one active optical component, in particular wherein in the opto-electronic module, the at least one active optical component and the at least one optics member are fixed with respect to one another. For example, the opto-electronic module can be a packaged component.

In some embodiments referring to one or both of the two last-addressed embodiments, the device is the opto-electronic module.

In some embodiments which may be combined with one or more of the before-addressed device embodiments comprising the opto-electronic module, the device comprises a printed circuit board on which the opto-electronic module is mounted. In particular, wherein the device is an electronic device.

In some embodiments which may be combined with one or more of the before-addressed device embodiments, the device comprises a wafer referred to as optics wafer, the optics wafer comprising a multitude of the optics members, in particular wherein the optics members are arranged (laterally) next to one another.

It is possible to provide that the device is or comprises the optics wafer.

In some embodiments referring to the before-addressed embodiment, the device comprises a wafer stack in which the optics wafer is comprised. It is possible to provide that the device is or comprises the wafer stack.

In some embodiments which may be combined with one or more of the before-addressed device embodiments comprising the opto-electronic module, the device comprises a wafer stack in which a multitude of the opto-electronic modules is comprised, in particular wherein the oopto-electronic modules are arranged (laterally) next to one another. It is possible to provide that the device is or comprises the wafer stack.

Additional aspects, features and advantages of the invention will be readily apparent from the detailed description, the accompanying drawings and the claims.

BRIEF DESCRIPTION OF THE DRAWINGS

Below, examples of the invention are described in more detail with reference to the drawings. The figures show schematically.

The reference symbols used in the figures and their meaning are summarized in the list of reference symbols. The described embodiments are intended as examples.

DETAILED DESCRIPTION

Figure 1:
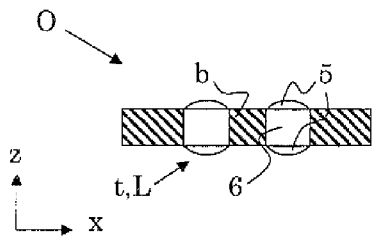
FIG. 1 a diagrammatical illustration of a cross-section through a device being a passive optical component.
Figure 2:
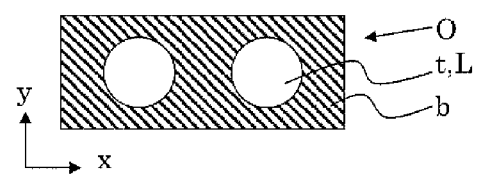
FIG. 2 a diagrammatical illustration of a top view of the device of FIG. 1.

FIG. 1 is a schematized diagrammatical illustration of a cross-section through a device being a passive optical component O. FIG. 2 is a schematized diagrammatical illustration of a top view of the device of FIG. 1. Passive optical component O can and will also be referred to as optics member O.

In FIG. 1, the vertical (z) direction is indicated, as well as the x direction. The directions indicated in FIG. 2 (directions in the x-y plane) are referred to as lateral directions.

Optics member O comprises a blocking portion b and two transparent portions t. In fact: Optics member O consists of a blocking portion b and two transparent portions t. Blocking portion b is made of a material, for example, a polymer material, which is substantially non-transparent for light of a specific spectral range (wavelength or wavelength range), whereas the transparent portions t are made of a material which is substantially transparent for light at least of the specific spectral range. This way, blocking portion b functions as an aperture for each of the transparent portions t and also fixes (or holds) the transparent portions t. And, as will become clearer later (cf. FIG. 12), blocking area b can function as a shield for protection from undesired light, by substantially attenuating or blocking light of the specific spectral range.

Each of the transparent portions t comprises at least two parts; in the example of FIGS. 1 and 2, it is three parts: Two lens elements 5 (or, more generally: optical structures 5) and a transparent element 6. Together, these form a lens member L (or, more generally: a passive optical component). Optical structures 5 protrude from the surface described by the blocking portion b; in other words, they extend vertically beyond the level described by the blocking portion b. When the optical structures 5 are lens elements (e.g., concave ones or, as shown in FIG. 1, convex ones) having at least one apex, these apices are located outside a vertical cross-section of the optics member O (FIG. 1).

Blocking portion b together with transparent elements 6 describes a (close-to-perfect) solid plate-like shape. The optical structures 5 protrude therefrom. Each of the transparent elements 6 has two opposing lateral surfaces which are substantially flat, i.e. two surfaces lying substantially in the x-y plane.

The outer shape of optics member O is generally plate- or disk-like, with rectangular side walls.

Particularly interesting is the manufacturability of the optics members O and of other devices according to the invention. In particular, wafer-level manufacturing is possible. This will be explained referring to FIGS. 3 to 14.

Figure 3:
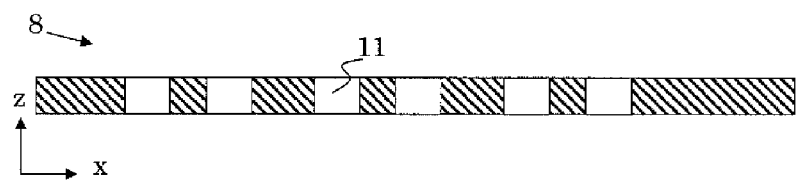
FIG. 3 a diagrammatical illustration of a manufacturing step in a cross-sectional view.

FIGS. 3 to 7 are schematized diagrammatical illustrations of manufacturing steps, in a cross-sectional view. FIG. 3 illustrates schematically a precursor wafer 8 made of non-transparent material, having a multitude of holes or openings 11. One or more of these are arranged, for example, on a rectangular lattice; since optics member O of FIGS. 1 and 2 to be manufactured comprises two transparent portions t, these two are arranged on a rectangular lattice.

Precursor wafer 8 can be manufactured by replication, e.g., using embossing or molding. Or a blank wafer can be provided with the openings 11 by drilling or etching.

It is to be noted that the shape of the openings 11 in precursor wafer 8 can of course be different from the cylindrical shape shown in FIGS. 1 to 3. The holes 11 need not be prismatic having a vertical axis, and a lateral cross-section does not have to be circular. E.g., elliptic shapes are possible; and the shape in a lateral cross-section may vary along the vertical direction; and the area described by the holes 11 in a lateral cross-section may vary along the vertical direction.

In a next step (cf. FIG. 4), the transparent elements 6 are formed by filling the openings 11 with a suitable transparent material T. During the filling, the transparent material T, for example, a polymer, is liquid or viscous. A squeegee process similar to what is known from screen printing can be used, or a dispenser, e.g., like known from semiconductor industry and used for underfilling, can be used. The dispensing can be carried out one-by-one, or several openings are simultaneously filled, e.g., by using several hollow needles outputting transparent material T.

During the filling, the precursor wafer 8 lies on a support layer 12, e.g., made of a silicone such as polydimethylsiloxane. Support layer 12 is supported by a rigid support substrate 13, e.g., a glass plate, for mechanical stability.

Figure 8:
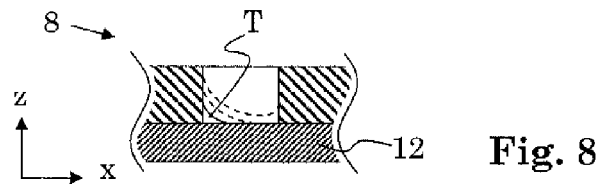
FIG. 8 a diagrammatical illustration of a cross-section illustrating a manufacturing step.
Figure 9:
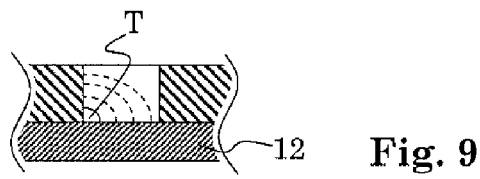
FIG. 9 a diagrammatical illustration of a cross-section illustrating a manufacturing step.

During filling-in the transparent material T, care has to be taken in order to prevent the formation of air bubbles or cavities in the material T, because this would likely degrade the optical properties of the passive optical components L to be produced, since transparent element 6 is a constituent thereof. E.g., one can carry out the dispensing in such a way that wetting of the wafer material starts at an edge formed by the precursor wafer 8 and the underlying support layer 12 or in a place close to such an edge; e.g., by suitably guiding a hollow needle outputting the material T close to such an edge. This is visualized in FIGS. 8 and 9 which are schematized diagrammatical illustrations of a cross-section for illustrating this manufacturing step. Depending on properties of the involved materials, more particularly of the surface tensions of transparent material T, of the material of precursor wafer 8 and of the material of support layer 13, the shapes described by the material T while being filled in into the holes 11 can vary and possibly look similar to what is schematically illustrated in FIG. 8 and in FIG. 9, respectively. The dashed lines indicate the time evolvement of the shape with increasing amount of filled-in material T, FIGS. 8 and 9 illustrating different behavior for different wetting angles.

Figure 10:
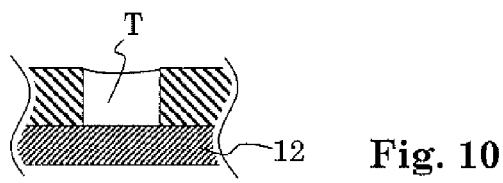
FIG. 10 a diagrammatical illustration of a detail of a cross-sectional view.
Figure 11:
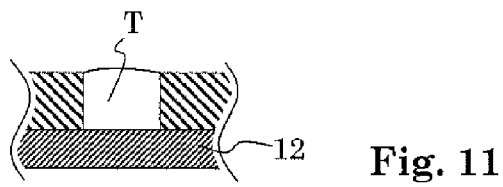
FIG. 11 a diagrammatical illustration of a detail of a cross-sectional view.

The filling-in is stopped when enough material T is filled in. Before proceeding, the filled-in transparent material T is hardened, e.g., by curing it, e.g., using heat or UV radiation. It is possible, that the so-obtained transparent elements have two (nearly) perfectly planar lateral surfaces, in particular (nearly) perfectly forming a common planar surface with the surrounding (blocking) portion of the precursor wafer 8. But possibly, the filling, accomplished using a squeegee or by dispensing or accomplished differently, may be less perfect. Examples therefor are shown in FIGS. 10 and 11, which are schematized diagrammatical illustrations of a detail of a cross-sectional view. E.g., a concave surface might be formed as illustrated in FIG. 10, or a convex surface might be formed as illustrated in FIG. 11. In the convex case, it can be advantageous to provide a polishing step before continuing with the next manufacturing steps. By means of the polishing, it is possible to achieve that the protruding portion is taken down at least partially. In addition, it is possible that polishing can remove spilled-over transparent material, i.e. material which has not been deposited in the desired location during filling-in, e.g., material that has not been deposited on a transparent element, but, e.g., slightly next thereto.

It is alternatively also possible to accomplish the formation of the transparent elements 6 in a different fashion involving finishing steps or not. By means of the support layer 12, it can be possible to ensure a rather planar surface of the transparent material T at that side of the safer, but other ways of accomplishing this might also be used.

Figure 5:
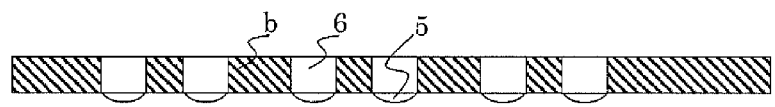
FIG. 5 a diagrammatical illustration of a manufacturing step in a cross-sectional view.
Figure 6:
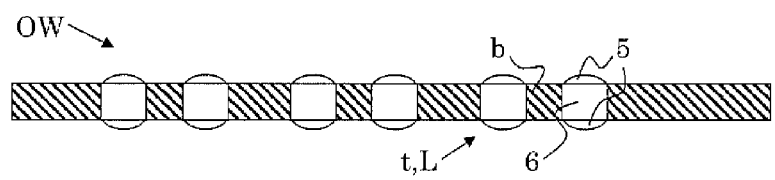
FIG. 6 a diagrammatical illustration of a cross-section through a device being an optics wafer.

When each of the openings 11 contains an appropriate amount of hardened transparent material T, optical structures 5 are applied thereto (cf. FIGS. 5 and 6). This can be accomplished, e.g., by replication, in a way known in the art, e.g., as described in WO 2005/083789 A2 or in US 2011/0050979 A1. E.g., in a form having a structured surface describing a negative of the optical structures 5 to be produced, a suitable amount of a replication material provided, and then, the form with the structured surface is moved towards the wafer, so as to get the replication material in an appropriate contact with a transparent element 6. Subsequently, the replication material is hardened, e.g., cured, e.g., by heating or irradiating with light (such as UV light), and the form is removed. The formation of the optical structures 5 (by replication or differently) may be accomplished one-by-one or several at a time (but only a fraction of all on one side the wafer), or simultaneously for all on one side the wafer.

The optical structures 5 can be formed on one or on both sides of the wafer (cf. FIGS. 5 and 6). The lateral extension of the optical structures 5 can be larger or smaller than the lateral extension of the transparent elements 6, or substantially be identical, as shown in FIGS. 5 and 6. The optical structures 5 can be lens elements of virtually any shape, be it refractive and/or diffractive lens elements, or prism elements or others. For many applications, lens elements are a suitable choice.

The so-obtained optics wafer OW (cf. FIG. 6) can be a device itself and can be used, e.g., for producing further products.

Figure 7:
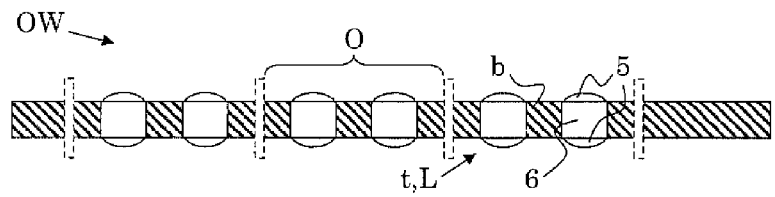
FIG. 7 a diagrammatical illustration of a cross-section through a device being an optics wafer.

It is also possible to separate such an optics wafer OW into a multitude of optics member like those shown in FIGS. 1 and 2, e.g., by dicing. In FIG. 7 showing a schematized diagrammatical illustration of a cross-section through a device being an optics wafer OW, the thin dashed rectangles indicate where separation can take place.

Figure 12:
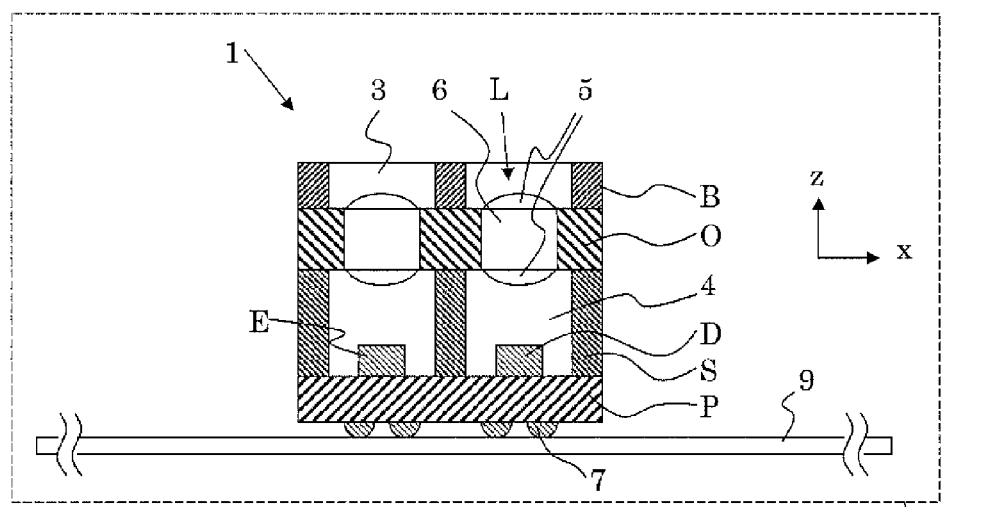
FIG. 12 a diagrammatical illustration of a cross-section through a device being an opto-electronic module illustrating a device being an electronic device.

FIG. 12 is a schematized diagrammatical illustration of a cross-section through a device being an opto-electronic module 1 also illustrating a device being an electronic device 10 comprising such an opto-electronic module 1 mounted on a printed circuit board 9 of the electronic device 10. The electronic device 10 can be, e.g., a hand-held electronic communication device such as a smart phone, or a photographic device such as a photo camera or a video camera.

The opto-electronic module 1 comprises an optics member O as shown in FIGS. 1 and 2 and also at least one active optical component such as a detector D (e.g., a photo diode) and a light emitter E (e.g., a light-emitting diode). The active optical components D, E are mounted on a substrate P provided with solder balls 7. Between substrate P and optics member O, a separation member S (or spacer member S) with openings 4 is arranged, i.a. for ensuring a suitable distance between the active optical components D, E and the passive optical components L. On top, a baffle member B having transparent regions 3 is arranged functioning as a baffle.

The substrate P, the optics member O, the baffle member B and the separating member S are of generally block- or plate-like shape (wherein at least the separating member S and the baffle member B have at least one hole each). This way, it is possible that a particularly good manufacturability is achieved.

There exists a specific wavelength range for which the passive optical components L and thus the transparent material T and the material of which the optical structures 5 are made (which may be identical with or different from material T) are transparent, but for which the material of which the blocking portion b is made is non-transparent.

There is, e.g., if the opto-electronic module 1 is a proximity sensor, an overlapping wavelength range of the wavelength range of light emittable by light emitter E and the wavelength range of light detectable by the light detector D. At least in that overlapping wavelength range, blocking portion b will be non-transparent, and at least in a portion of the overlapping wavelength range, transparent portion t will be transparent. Note that the term wavelength range does not imply that it is contiguous. The overlapping wavelength range can be in the infrared portion and more specifically in the near-infrared portion of the electromagnetic spectrum. This can be particularly useful for proximity sensor.

An opto-electronic module 1 as shown in FIG. 12 can well be manufactured on wafer-scale. Therein, optics wafers like shown in FIG. 6 can be used.

Figure 13:
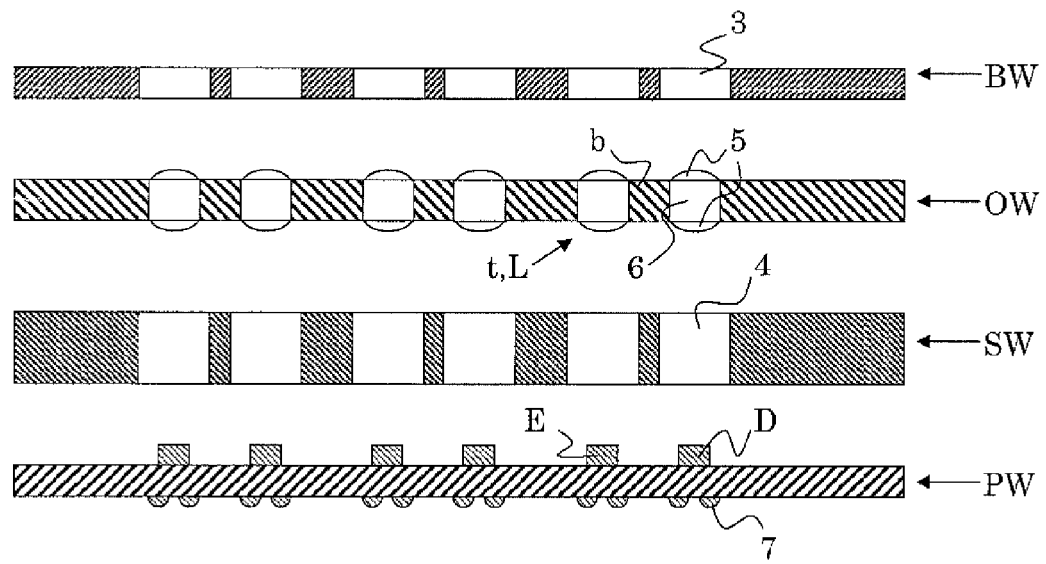
FIG. 13 a cross-sectional view of wafers for forming a wafer stack for manufacturing a multitude of modules of FIG. 12.

FIG. 13 is a schematized cross-sectional view of wafers for forming a wafer stack 2 (cf. FIG. 14) for manufacturing a multitude of modules 1 of FIG. 12.

Four wafers are sufficient for manufacturing a multitude of modules 1 as shown in FIG. 12: A substrate wafer PW, a spacer wafer SW, an optics wafer OW (like shown in FIG. 6) and a baffle wafer BW. Each wafer comprises a multitude of the corresponding members comprised in the corresponding module 1 (cf. FIG. 12), arranged, for example, on a rectangular lattice, e.g., with a little distance from each other for a wafer separation step.

Substrate wafer PW can be a printed circuit board (PCB) of standard PCB materials, provided with solder balls 7 on the one side and with active optical components (E and D) soldered to the other side. The latter can be placed on substrate wafer PW by pick-and-place using standard pick-and-place machines.

Ways of manufacturing optics wafer OW have been described above.

In order to provide maximum protection from detecting undesired light, all wafers PW, SW, OW, BW can substantially be made of a material substantially non-transparent for light detectable by detecting members D, of course except for transparent portions t and transparent regions 3.

Wafers SW and BW and possibly also all or a portion of wafer OW can be produced by replication. In an exemplary replication process which can also be used for manufacturing precursor wafer 8 or transparent elements 6, a structured surface is embossed into a liquid, viscous or plastically deformable material, then the material is hardened, e.g., by curing using ultraviolet radiation or heating, and then the structured surface is removed. Thus, a replica (which in this case is a negative replica) of the structured surface is obtained. Suitable materials for replication are, e.g., hardenable is (more particularly curable) polymer materials or other replication materials, i.e. materials which are transformable in a hardening step (more particularly in a curing step) from a liquid, viscous or plastically deformable state into a solid state. Replication is a known technique, cf., e.g., WO 2005/083789 A2 or US 2011/0050979 A1 for more details about this.

Figure 14:
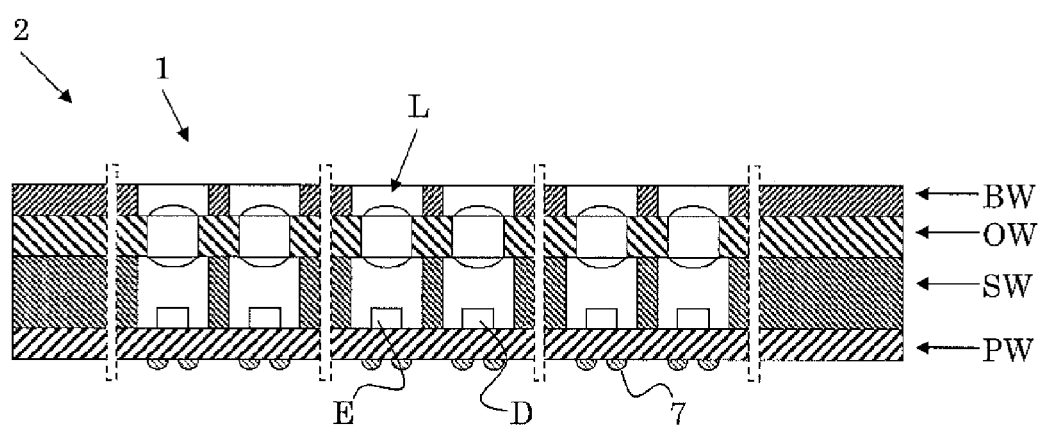
FIG. 14 a cross-sectional view of a device being a wafer stack for manufacturing a multitude of modules of FIG. 12.

FIG. 14 is a schematized cross-sectional view of a device being a wafer stack 2 for manufacturing a multitude of modules 1 of FIG. 12.

In order to form a wafer stack 2, the wafers BW, OW, SW, PW are aligned and glued together, e.g., using a heat-curable epoxy resin. The aligning comprises aligning the substrate wafer PW and the optics wafer OW such that each of the detecting members D is aligned with respect to at least one of the transparent portions t, in particular wherein each of the detecting members D is aligned in the same way to one of the transparent portions t each, and the same applies to the light emitters E.

The thin dashed rectangles indicate where separation takes place, e.g., by means of a dicing saw.

Although FIGS. 3 to 7 and 13 and 14 only show provisions for three modules 1, there can be in one wafer stack provisions for at least 10, rather at least 30 or even more than 50 modules in each lateral direction.

It is to be noted that it is possible to think of devices which comprise an optics member O, wherein the optics member is not comprised in an opto-electronic module 1.

It is further to be noted that the passive optical components L obtained in a manner described above are not unitary parts. They comprise at least two, e.g., two or three constituents, namely transparent element 6 and optical structures 5 attached thereto. Transparent element 6, however, can be a unitary part.

A semi-finished part (which can in a certain view also be a device according to the invention) obtained by providing the transparent elements 6 in a precursor wafer 8 can be a flat disk-like wafer having no holes penetrating the wafer (or at least no holes penetrating the wafer in the regions where the transparent portions t are).

The semi-finished part can have virtually no or only shallow surface corrugations in those regions, wherein such surface corrugations, if present, can be, for example, concave (cf. FIG. 10), i.e. do not extend beyond the wafer surface as described by the at least one blocking portion b. Convex meniscuses possibly formed can be flattened, e.g., as described above, by polishing, so as to obtain a transparent element 6 having parallel surfaces adjusted to the wafer thickness, wherein possibly also the wafer thickness can be adjusted (reduced).

But: The semi-finished part can alternatively have a structured surface, on one or on both sides, in particular in those regions where the transparent portions t are. There can be wanted corrugations in blocking portion b. In particular, it is possible that a wafer, a "combined optics wafer", is provided which is a combination of an optics wafer (such as the described optics wafer OW) and a spacer wafer (such as the described spacer wafer SW). Accordingly, then, the spacer wafer is optional, its properties and functions are fulfilled by an optics wafer ("combined optics wafer") structured and configured accordingly. This can be accomplished, e.g., by manufacturing as a unitary part: what is described above as spacer wafer SW and what is described above as at least one blocking portion b. A corresponding optics wafer ("combined optics wafer") can be readily visualized when looking upon wafers OW and SW in FIG. 14 as one single part. Starting from a suitable semi-finished part, a "combined semi-finished part", a "combined optics wafer" can be obtained by producing thereon (on transparent portions of the "combined semi-finished part") optical structures, e.g., in a way as described above, e.g., by dispensing.

Figure 15:
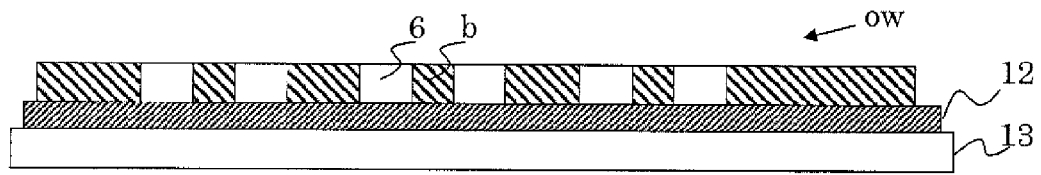
FIG. 15 a diagrammatical illustration of a cross-section through a device being a semi-finished part.
Figure 16:
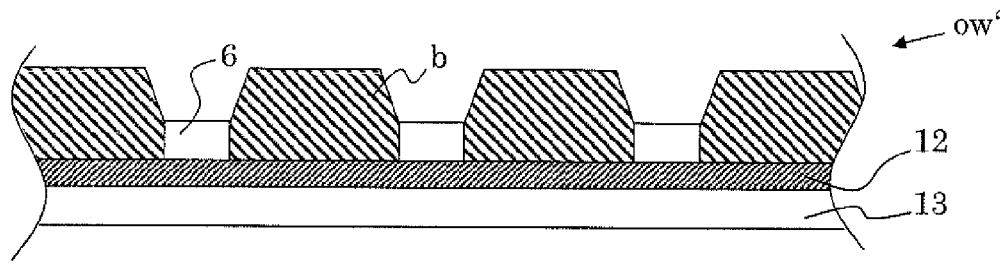
FIG. 16 a diagrammatical illustration of a cross-section through a device being a semi-finished part.

Another example of a "combined semi-finished part" (referenced ow') is illustrated in FIG. 16, whereas a semi-finished part ow which more closely corresponds to what is described in conjunction with FIGS. 3 to 7 and 12 to 14 is illustrated in FIG. 15.

Furthermore an optics wafer ("combined optics wafer") can be provided which is a combination of an optics wafer (such as the described optics wafer OW) and a baffle wafer (such as the described baffle wafer BW). Accordingly, then, the baffle wafer is optional, its properties and functions are fulfilled by an optics wafer ("combined optics wafer") which is structured and configured accordingly. This can be accomplished, e.g., by manufacturing as a unitary part: what is described above as baffle wafer BW and what is described above as at least one blocking portion b. A corresponding optics wafer can be readily visualized when looking upon wafers OW and BW in FIG. 14 as one single part. A suitable "combined semi-finished part" might look silimar ti what is shown in FIG. 16.

Of course, it is also possible that both sides of an optics wafer ("combined optics wafer") are structured. E.g., so as to make, in the embodiment of FIG. 14, baffle wafer BW and spacer wafer SW obsolete.

Figure 4:
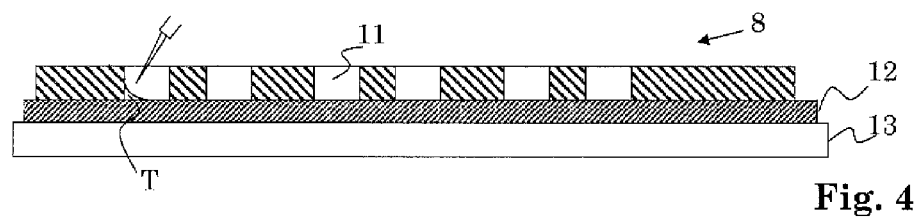
FIG. 4 a diagrammatical illustration of a manufacturing step in a cross-sectional view.

Filling-in of transparent material T into a single- or both-sidedly structured precursor wafer for forming the transparent elements 6 (for obtaining a semi-finished part) can be accomplished similarly to what is shown in FIG. 4 (and what is implied in FIG. 16 by the support layer 12), wherein in FIG. 16, a not-structured side of "combined semi-finished part" ow' faces the support layer 12. Alternatively, a structured support layer 12 could be used during forming the transparent elements 6, for avoiding a (too intense) flowing-through of filled-in material through the openings of the precursor wafer. The latter was of proceeding can be particularly useful when a precursor wafer having a structured surface on both sides shall be provided with the transparent elements 6.

Corresponding to what has just been described for wafers, a "combined optics member" can also be provided. The blocking portion of an optics member can have a structured surface, in particular a surface with protruding portions protruding vertically beyond a surface of a transparent element of the "combined optics member". It is possible that a member ("combined optics member") is provided which is a combination of the above-described optics member and the above-described separation member (or a combination of the described optics member and the described baffle member, or a combination of all three). Accordingly, then, the separation member (and/or the baffle member) is optional, its properties and functions are fulfilled by an optics member which is structured and configured accordingly. This can be accomplished, e.g., by manufacturing as a unitary part: what is described above as separation member S (and/or what is described above as baffle member B) and what is described above as at least one blocking portion b.

A usual consequence of providing such a "combined optics member" or "combined optics wafer" is that the number of parts (of an item to be constructed, such as of a module 1) and the number of assembly steps is reduced, and less aligning errors will usually occur.

Coming back to FIG. 15, the semi-finished part ow shown there can be subjected to a polishing step on one or on both sides. The polishing step can be accomplished, e.g., for thinning the wafer ow (precisely) to a desired thickness, and/or for improving the optical properties (at least of the transparent elements 6). Of course, also a one-sidedly structured semi-finished part can be polished, at least on its flat (not-structured) side. Furthermore, it is to be noted that it is possible to polish precursor wafers, on one or both sides, at least on at least one flat side. Doing so not only possibly contributes to a flatter and/or more even surface of the precursor wafer, but may allow to reduce the thickness of the precursor wafer to a desired thickness, which may be helpful in possible subsequent manufacturing steps.

If a semi-finished part ("combined" or not) is itself a device and shall be used without producing optical structures on the transparent elements 6, it can be useful to polish one or both sides, for achieving an optical grade surface, in particular a surface being particularly plane and having a particularly small surface roughness.

When, for obtaining an optics wafer, optical structures 5 are applied (e.g., by means of replication) to a semi-finished part, where concave meniscuses of the transparent material T are present, the replication can take place on these meniscuses, wherein the amount of applied replication material might have to be adjusted accordingly. If a corresponding semi-finished part is polished, well-defined flat surfaces can be obtained, and less variation is provided for subsequent replication steps. Thus, replication is likely to be carried out easier and/or can lead to a more stable (and reproduceable) process and to a possibly better precision.

The materials which are hardened, for example, cured, during a manufacturing process described anywhere above can be polymer-based materials such as epoxy resins.

Due to manufacturing on wafer-level, most alignment steps are carried out on wafer-level making it possible to achieve a very good alignment (in particular of members D and E with respect to passive optical component L) in a rather simple and very fast way. The overall manufacturing process is very fast and precise. Due to the wafer-scale manufacturing, only a very small number of production steps is required for manufacturing a multitude of modules 1 and/or a multitude of optics members O.

The optics member O (and also the other addressed devices) can be useful in many applications, in particular where apertures are applied and/or where protection from light is sought, and/or where mass production is necessary and/or where particularly small optical members (or passive optical components) are needed.

Other implementations are within the scope of the claims.

List Of Reference Symbols 1 device, opto-electronic module
2 device, wafer stack
3 transparent region
4 opening
5 optical structure, lens element
6 transparent element
7 solder ball
8 precursor wafer
9 printed circuit board
10 device, electronic device, smart phone
11 hole, opening
12 support layer
13 support substrate b blocking portion, non-transparent portion
B baffle member
BW baffle wafer
D detector, light detector, photo diode
E light emitter, light-emitting diode
L passive optical component, lens member
O device, optics member
ow device, semi-finished part
ow' device, semi-finished part, "combined semi-finished part"
OW device, optics wafer
P substrate
PW substrate wafer
S separation member
SW spacer wafer
t transparent portion
T transparent material

What is claimed is:

1. A device comprising at least one optics member comprising at least one transparent portion and at least one blocking portion, wherein the at least one transparent portion is made of one or more transparent materials substantially transparent for light of at least a specific spectral range, and the at least one blocking portion is made of one or more non-transparent materials substantially non-transparent for light of the specific spectral range, wherein the transparent portion comprises at least one passive optical component, the at least one passive optical component comprising a transparent element having two opposing at least approximately flat surfaces substantially perpendicular to a vertical direction, and, attached to the transparent element, at least one optical structure, wherein a vertical extension of the transparent element is at least approximately equal to a vertical extension of said at least one blocking portion.

2. The device according to claim 1, wherein the at least one blocking portion is made of a hardened hardenable material.

3. The device according to claim 1, wherein the transparent element is made of a hardened hardenable material.

4. The device according to claim 1, wherein the at least one optical structure is made of a hardened hardenable material.

5. The device according to claim 1, wherein the at least one blocking portion and the at least one optical structure are manufactured using replication.

6. The device according to claim 1, wherein the at least one optical structure comprises at least one lens element.

7. The device according to claim 1, wherein the passive optical component comprises at least one optical structure attached to each of the opposing surfaces.

8. The device according to claim 1, wherein the device is a hand-held communication device.

9. The device according to claim 1, the at least one transparent element forming a common planar surface with the surrounding at least one blocking portion, the common planar surface being substantially perpendicular to the vertical direction.

10. The device according to claim 1 comprising an opto-electronic module in which the at least one optics member is comprised.

11. The device according to claim 10, wherein the device is the opto-electronic module.

12. The device according to claim 10 comprising a printed circuit board on which the opto-electronic module is mounted.

13. The device according to claims 10, comprising a wafer stack in which a multitude of the opto-electronic modules is comprised.

14. The device according to claim 1 comprising an optics that comprises a multitude of the optics members.

15. The device according to claims 14, wherein the device is the optics wafer.

16. The device according to claim 14, comprising a wafer stack in which the optics wafer is comprised.

17. The device according to claim 16, wherein the device is the wafer stack.

18. A device comprising at least one optics member comprising at least one transparent portion and at least one blocking portion, wherein said at least one transparent portion is made of one or more materials substantially transparent for light of at least a specific spectral range, referred to as transparent materials, and said at least one blocking portion is made of one or more materials substantially non-transparent for light of said specific spectral range, referred to as non-transparent materials, wherein said transparent portion comprises at least one passive optical component, said at least one passive optical component comprising a transparent element having two opposing at least approximately flat surfaces substantially perpendicular to a vertical direction, and, attached to said transparent element, at least one optical structure, wherein the at least one blocking portion together with the at least one transparent element describes a solid plate-like shape with opposing planar surfaces.

* * * * *